United States Patent
Jeon et al.

(10) Patent No.: US 11,024,821 B2
(45) Date of Patent: Jun. 1, 2021

(54) ORGANIC LIGHT-EMITTING DISPLAY DEVICE

(71) Applicant: LG Display Co., Ltd., Seoul (KR)

(72) Inventors: Seongsu Jeon, Gwangmyeong-si (KR); Seungryong Joung, Gimpo-si (KR); Taewoo Jeon, Paju-si (KR); Mi-Young Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 63 days.

(21) Appl. No.: 16/225,999

(22) Filed: Dec. 19, 2018

(65) Prior Publication Data

US 2019/0207138 A1    Jul. 4, 2019

(30) Foreign Application Priority Data

Dec. 29, 2017   (KR) .................. 10-2017-0184053

(51) Int. Cl.
*H01L 51/50*    (2006.01)
*H01L 51/52*    (2006.01)
*H01L 27/32*    (2006.01)

(52) U.S. Cl.
CPC ........ *H01L 51/504* (2013.01); *H01L 27/3209* (2013.01); *H01L 51/5056* (2013.01); *H01L 51/5072* (2013.01); *H01L 51/5092* (2013.01); *H01L 51/5206* (2013.01); *H01L 51/5221* (2013.01); *H01L 51/5278* (2013.01); *H01L 27/3244* (2013.01); *H01L 2251/558* (2013.01)

(58) Field of Classification Search
CPC .................................................. H01L 27/3209
See application file for complete search history.

(56) References Cited

U.S. PATENT DOCUMENTS

2010/0133573 A1   6/2010   Nowatari et al.
2014/0167014 A1   6/2014   Liping et al.

FOREIGN PATENT DOCUMENTS

CN       104638115 A      5/2015
JP        5624932        * 10/2014
WO     2012/141107 A1    10/2012

* cited by examiner

*Primary Examiner* — Walter H Swanson
(74) *Attorney, Agent, or Firm* — Seed IP Law Group LLP (57) ABSTRACT

One embodiment of the present disclosure provides an organic light-emitting element corresponding to each pixel region. The organic light-emitting element includes a hole transport layer, a first light-emitting layer, a second light-emitting layer, a third light-emitting layer, a fourth light-emitting layer, and an electron transport layer. The first light-emitting layer includes a first dopant corresponding to a first color and a first host. The second light-emitting layer includes a second dopant corresponding to a second color different from the first color and a second host different from the first host. The third light-emitting layer includes the first dopant and the second host, and the fourth light-emitting layer includes the second dopant and the second host.

8 Claims, 9 Drawing Sheets

ORGANIC LIGHT-EMITTING DISPLAY DEVICE

CROSS-REFERENCE TO RELATED APPLICATIONS

This application claims the priority of Korean Patent Application No. 10-2017-0184053 filed on Dec. 29, 2017, in the Korean Intellectual Property Office, the disclosure of which is hereby incorporated by reference in its entirety.

BACKGROUND

Technical Field

The present disclosure relates to an organic light-emitting display device including organic light-emitting elements, each element corresponding to each pixel region.

Description of the Related Art

A display device is applied to various electronic devices such as TVs, mobile phones, notebooks and tablets. Researches for thinning, weight-saving and low-power consumption for the display device have been continued.

A typical example of the display device may include a liquid crystal display device (LCD), a plasma display device (PDP), a field emission display device (FED), an electroluminescence display device (ELD), an electro-wetting display device (EWD) and an organic light emitting display device (OLED).

The organic light-emitting display device includes a plurality of organic light-emitting elements corresponding to a plurality of pixel regions defined in a display region in which an image is displayed. Since each organic light-emitting element is a self-light-emitting element that emits light by itself, the organic light-emitting display device has a faster response speed than the liquid crystal display device, has a high luminous efficiency, a larger luminance and viewing angle, and is excellent in contrast ratio and color rendering rate.

The organic light-emitting display device displays an image using each unit pixel including two or more pixel regions corresponding to different colors to display a color image. In this connection, the color of each pixel region may correspond to each organic light-emitting element. Alternatively, the organic light-emitting element of each pixel region emits white light, and the color of each pixel region may correspond to a color filter.

The organic light-emitting element emitting white light may include two or more light emitting layers corresponding to different colors disposed between the hole transporting layer and the electron transporting layer.

In this connection, two or more light-emitting layers corresponding to different colors include different dopants and different hosts.

Due to a mobility difference between the different hosts, two or more light-emitting layers may have different thicknesses.

Further, at the interface between different hosts, the mobility changes rapidly, so that the exciton-profile is configured to correspond to the region adjacent to the interface between different hosts. The exciton-profile represents an estimate of the amount of excitons to be generated from the two or more light-emitting layers disposed between the hole transport layer and the electron transport layer.

As for the configuration including at least two light-emitting layers disposed between the hole transport layer and the electron transport layer, the thickness of each light-emitting layer is set based on the mobility difference between the different hosts and the exciton-profile.

Accordingly, there is a problem that it is practically impossible to control the luminosity of each color corresponding to each light-emitting layer. As a result, it is difficult to control the luminance and chromaticity coordinates of the organic light-emitting element, so that the application range of the organic light-emitting display device is limited.

BRIEF SUMMARY

The present disclosure is intended to provide an organic light-emitting display device in which the luminance and color coordinates of an organic light-emitting element may be adjusted relatively easily.

The purposes of the present disclosure are not limited to the above-mentioned purposes. Other purposes and advantages of the present disclosure, as not mentioned above, may be understood from the following descriptions and more clearly understood from the embodiments of the present disclosure. Further, it will be readily appreciated that the objects and advantages of the present disclosure may be realized by features and combinations thereof as disclosed in the claims.

In one aspect of the present disclosure, there is provided an organic light-emitting display device including an organic light-emitting element corresponding to each pixel region, wherein the organic light-emitting element includes: first and second electrodes; and an organic material layer disposed between the first and second electrodes, the organic material layer including at least one stack, wherein one of the at least one stack includes: a hole transport layer adjacent to the first electrode; a first light-emitting layer disposed on the hole transport layer and including a first dopant corresponding to a first color and a first host; a second light-emitting layer disposed on the first light-emitting layer, the second light-emitting layer including a second dopant corresponding to a second color different from the first color and a second host different from the first host; a third light-emitting layer disposed on the second light-emitting layer, the third light-emitting layer including the first dopant and the second host; a fourth light-emitting layer disposed on the third light-emitting layer, the fourth light-emitting layer including the second dopant and the second host; and an electron transport layer disposed on the fourth light-emitting layer and adjacent to the second electrode.

In one implementation of the organic light-emitting display device, a thickness of the third light-emitting layer is selected from a range of 10 Å to 20 Å.

In one implementation of the organic light-emitting display device, a thickness of the second light-emitting layer is selected from a range of 100 Å to 200 Å.

In one implementation of the organic light-emitting display device, a thickness of the second light-emitting layer is selected from a range of 200 Å to 300 Å.

In one implementation of the organic light-emitting display device, a sum of the thicknesses of the second and fourth light-emitting layers is selected from a range of 300 Å to 350 Å.

In one implementation of the organic light-emitting display device, the thickness of the fourth light-emitting layer is selected from a range of 50 Å to 250 Å.

In one implementation of the organic light-emitting display device, a sum of the thicknesses of the first, second, third, and fourth light-emitting layers is selected from a range of 450 Å to 550 Å, wherein the thickness of the first light-emitting layer is selected from a range of 150 Å to 200 Å.

In one implementation of the organic light-emitting display device, the first color has a longer wavelength than the second color.

In one implementation of the organic light-emitting display device, the first color is red and the second color is green.

In one implementation of the organic light-emitting display device, another of the at least one stack includes a blue light-emitting layer emitting blue light.

The organic light-emitting display device according to the present disclosure includes the organic light-emitting element corresponding to each pixel region. The organic light-emitting element includes at least one stack disposed between the first and second electrodes facing away each other. One of the at least one stack includes the first, second, third and fourth light-emitting layers sequentially disposed between the hole transport layer and the electron transport layer. In this connection, the first light-emitting layer contains the first dopant corresponding to the first color and the first host. Each of the second and fourth light-emitting layers contains the second dopant corresponding to the second color different from the first color and the second host. Further, the third light-emitting layer includes the first dopant and the second host.

The third light-emitting layer includes the second host as in the second and fourth light-emitting layers. As such, the exciton-profile may be formed in a portion of the second light-emitting layer adjacent to the boundary between the first and second host, i.e., adjacent to the boundary between the first and second light-emitting layers.

Further, the third light-emitting layer is disposed between the second and fourth light-emitting layers corresponding to the second color. The third light-emitting layer, as in the first light-emitting layer, contains the first dopant corresponding to the first color.

Thus, depending on the exciton-profile in the region in which the third light-emitting layer is disposed, the luminosity of each of the first and second colors may be increased and/or decreased.

In other words, the luminosity of each of the first and second colors may be easily controlled by the third light-emitting layer. This leads to the advantage that the application range of the organic light-emitting display device may be improved since the luminance and color coordinate of the organic light-emitting element may be easily controlled.

In addition, since the energy of the second dopant in each of the second and fourth light-emitting layers may be transferred to the first dopant in the third light-emitting layer, the deterioration of the second dopant may be delayed. As a result, the lifespan of the second color may be improved.

DETAILED DESCRIPTION

Examples of various embodiments are illustrated and described further below. It will be understood that the description herein is not intended to limit the claims to the specific embodiments described. On the contrary, it is intended to cover alternatives, modifications, and equivalents as may be included within the spirit and scope of the present disclosure as defined by the appended claims.

The same reference numbers in different FIGS. denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

The terminology used herein is for describing particular embodiments only and is not intended to be limiting of the present disclosure. As used herein, the singular forms "a"

and "an" are intended to include the plural forms as well, unless the context clearly indicates otherwise. It will be further understood that the terms "comprise", "comprising", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an organic light-emitting display device according to one embodiment of the present disclosure will be described in detail with reference to the accompanying drawings.

Figure 1:
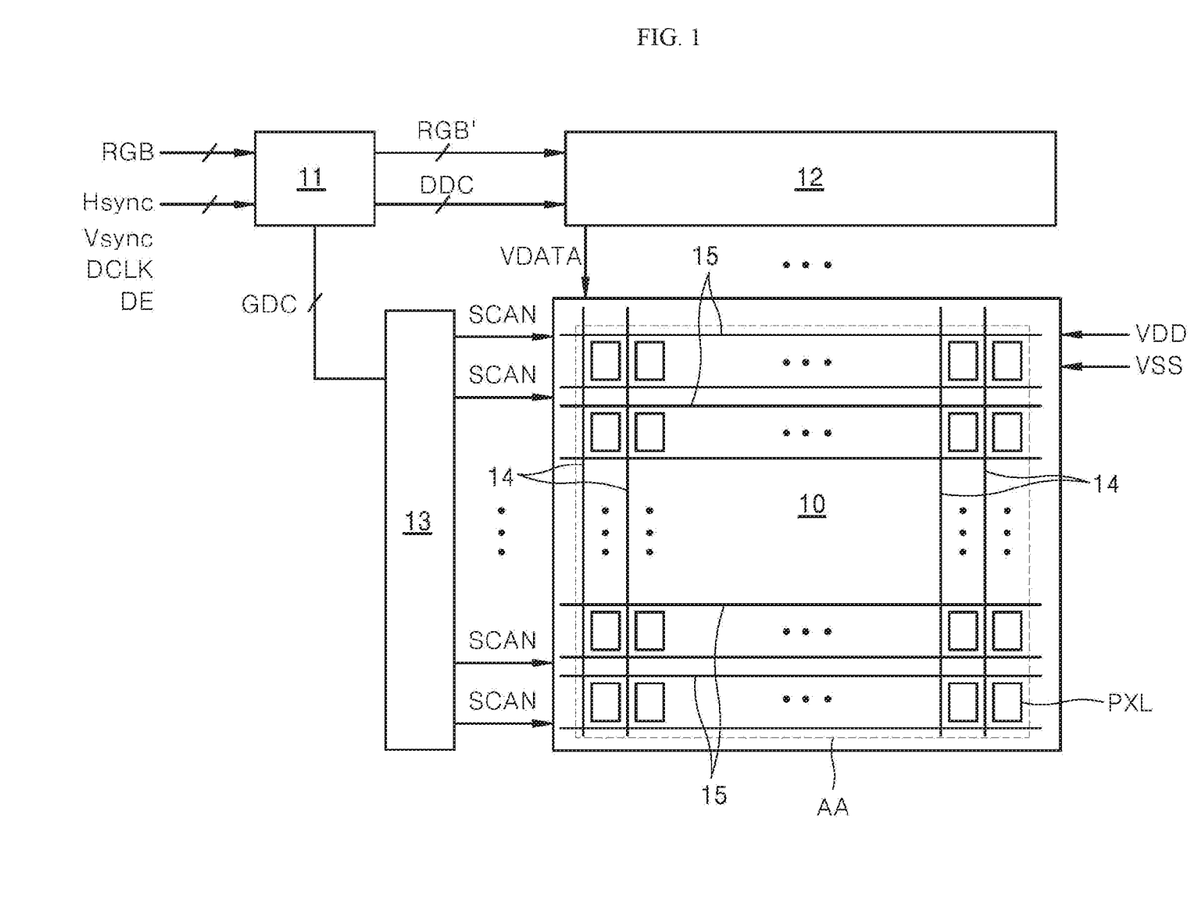
FIG. 1 shows an organic light-emitting display device according to one embodiment of the present disclosure.
Figure 2:
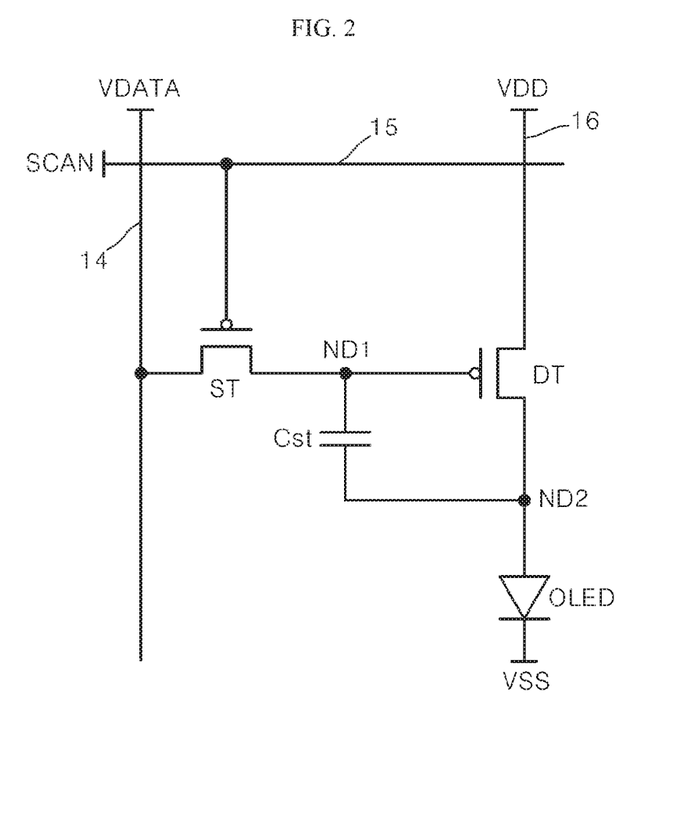
FIG. 2 shows one example of an equivalent circuit corresponding to one pixel region in the organic light-emitting display device of FIG. 1.
Figure 3:
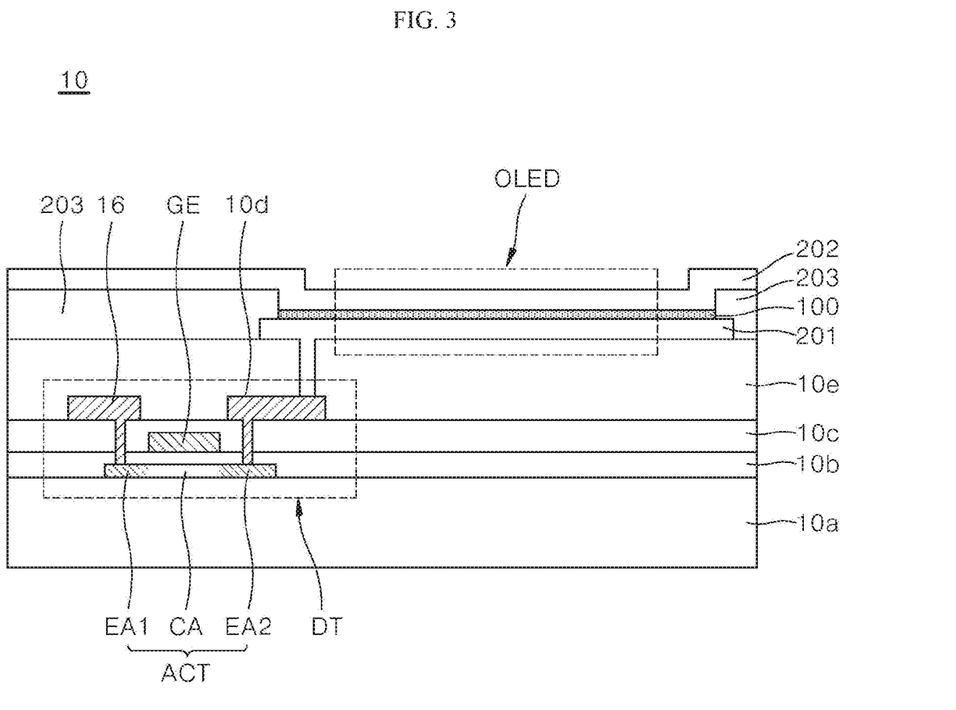
FIG. 3 shows one example of a cross-section of a driving thin-film transistor and organic light-emitting element of FIG. 2.

FIG. 1 shows an organic light-emitting display device according to one embodiment of the present disclosure. FIG. 2 shows one example of an equivalent circuit corresponding to one pixel region in the organic light-emitting display device of FIG. 1. FIG. 3 shows one example of a cross-section of a driving thin-film transistor and organic light-emitting element of FIG. 2.

As shown in FIG. 1, the organic light-emitting display device according to one embodiment of the present disclosure includes a display panel 10 including a plurality of pixel regions PXLs arranged in a matrix within a display region AA in which images are displayed; a data drive unit 12 for driving data-lines 14 of the display panel 10, a gate drive unit 13 for driving scan-lines 15 of the display panel 10, and a timing controller 11 for controlling a driving timing of each of the data drive unit 12 and the gate drive unit 13.

Further, the display panel 10 includes scan-lines 15, each corresponding to each horizontal line including pixel regions PXLs arranged in a row in a horizontal direction, and data-lines 14, each corresponding to a vertical line including pixel regions PXLs arranged in a column in a vertical direction.

In this connection, the scan signal SCAN from the scan-line 15 is configured to sequentially select each horizontal line to write data to the pixel region PXL.

The plurality of pixel regions PXLs may be defined by intersecting scan-lines 15 and data-lines 14. Accordingly, the plurality of pixel regions PXLs may be arranged in a matrix form in the display region AA.

Further, the display panel 10 includes a first power supply line for supplying a first drive voltage VDD to the plurality of pixel regions PXLs, a second power supply line for supplying a second drive voltage VSS lower than the first drive voltage VDD to the plurality of pixel regions PXLs.

The timing controller 11 rearranges digital video data RGB input from the outside according to a resolution of the display panel 10 and supplies the rearranged digital video data RGB' to the data drive unit 12.

Further, the timing controller 11 generates and supplies a data control signal DDC for controlling an operation timing of the data drive unit 12 and a gate control signal GDC for controlling an operation timing of the gate drive unit 13, based on timing signals such as a vertical synchronization signal Vsync, a horizontal synchronization signal Hsync, a dot clock signal DCLK, and a data enable signal DE.

The data drive unit 12 converts the rearrange digital video data RGB' into an analog data voltage based on the data control signal DDC. Further, the data drive unit 12 supplies a data signal VDATA to pixel regions corresponding to each horizontal line via the data-line 15 for each horizontal period, based on the rearranged digital video data RGB'.

The gate drive unit 13 generates and sequentially supplies a scan signal SCAN to the scan-line 15 of each horizontal line based on the gate control signal GDC.

Although not separately shown in FIG. 1, the display panel 10 includes a pair of substrates bonded together facing each other and an organic light-emitting elements array disposed therebetween. Further, one of the pair of substrates may be implemented as a thin-film transistor array substrate. The thin-film transistor array substrate has a plurality of pixel regions PXLs defined therein and supplies a driving current to an organic light-emitting element in each pixel region PXL.

As shown in FIG. 2, each pixel region PXL includes an organic light-emitting element OLED, a driving thin-film transistor DT, a switching thin-film transistor ST, and a storage capacitor Cst.

An organic light-emitting element OLED includes first and the second electrode s (e.g., anode and cathode), and a layer of organic material disposed therebetween. In one example, the layer of organic material may contain at least one stack and a charge generation layer between the stacks. Further, each stack may include a hole transport layer, an at least one light-emitting layer, and an electron transport layer. Alternatively, the organic material layer may further include a hole injection layer positioned between the first electrode and the hole transport layer and an electron injection layer positioned between the second electrode and the electron transport layer. Such an organic light-emitting element OLED will be described in more detail below.

The driving thin-film transistor DT is disposed between the first power supply line 16, which supplies the first drive voltage VDD, and the second power supply line, which supplies the second drive voltage VSS below the first drive voltage VDD. The driving thin-film transistor DT is connected in series with the organic light-emitting element OLED.

The switching thin-film transistor ST is disposed between the data-line 14 for supplying a data signal VDATA to each pixel region and a first node ND1 connected to the gate electrode of the driving thin-film transistor DT.

The storage capacitor Cst is disposed between the first node ND1 and a second node ND2. The second node ND2 is a contact point between the driving thin-film transistor DT and the organic light-emitting element OLED.

The storage capacitor Cst is charged based on the data signal VDATA supplied to the first node ND1 via the switching thin-film transistor ST as is turned on.

Further, the driving thin-film transistor DT is turned on based on the charged voltage of the storage capacitor Cst, whereby a driving current corresponding to the data signal VDATA is supplied to the second node ND2, that is, to the organic light-emitting element OLED.

As shown in FIG. 3, a thin-film transistor array substrate in the display panel 10 of an organic light-emitting display device according to one embodiment of the present disclosure includes an organic light-emitting element OLED, and the driving thin-film transistor DT corresponding to each pixel region PXL.

In one example, the driving thin-film transistor DT includes an active layer ACT disposed on a substrate 10a and a gate electrode GE disposed on a gate insulating-film 10b covering the active layer ACT.

The active layer ACT includes a channel region CA overlapping the gate electrode GE, and first and second electrode regions EA1 and EA2 corresponding to and both lateral ends of the channel region CA, respectively.

The active layer ACT may be made of low temperature grown polysilicon (LTPS).

In this case, the channel region CA may be made of undoped semiconductor material, while each of the first and second electrode regions EA1 and EA2 may be made of a semiconductor material doped with a dopant at a higher concentration than that in the channel region CA.

In one example, one of the first and the second electrode regions EA1 and EA2, e.g., the first electrode regions EA1, may be connected to the first power supply line 16 disposed on the interlayer insulating-film 10c covering the gate electrode GE. Further, the other of the first and second electrode regions EA1 and EA2, for example, the second electrode region EA2 may be connected to a conductive pattern 10d disposed on the interlayer insulating-film 10c.

The first power supply line 16 and the conductive pattern 10d are covered with an over-coated film 10e.

The conductive pattern 10d is connected to the first electrode 201 of the organic light-emitting element OLED disposed on the over-coated film 10e. The second electrode regions EA2 of the driving thin-film transistor DT and the first electrode 201 of the organic light-emitting element OLED are interconnected via the conductive pattern 10d. In other words, the conductive pattern 10d corresponds to the second node (ND2 in FIG. 2) between the driving thin-film transistor DT and the organic light-emitting element OLED.

The organic light-emitting element OLED includes the opposing first and second electrodes 201 and 202, and an organic material layer 100 disposed between the first and second electrodes 201 and 202 and including at least one stack.

In addition, the first electrode 201 on the over-coated film 10e corresponds to each pixel region PXL. The edge of the first electrode 201 is interrupted by a bank film 203.

The organic material layer 100 corresponds to a light-emitting region which is the at least portion of each pixel region PXL.

The second electrode 202 is arranged to cover the organic material layer 100 and the bank film 203.

Next, an organic light-emitting element OLED according to one embodiment of the present disclosure is described.

Figure 4:
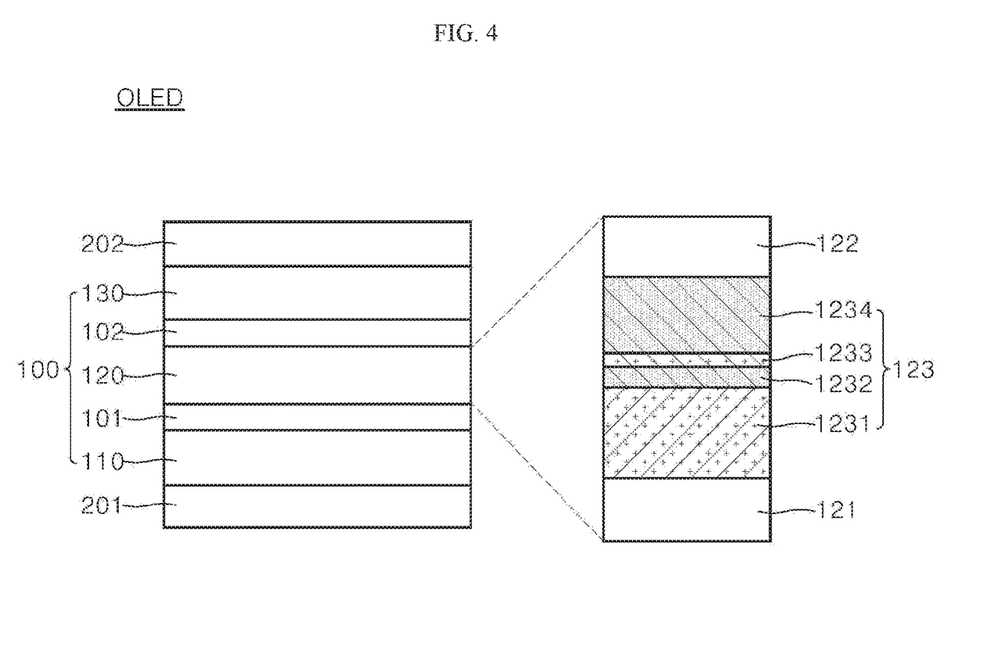
FIG. 4 shows the organic light-emitting element of FIG. 3 according to one embodiment of the present disclosure.
Figure 5:
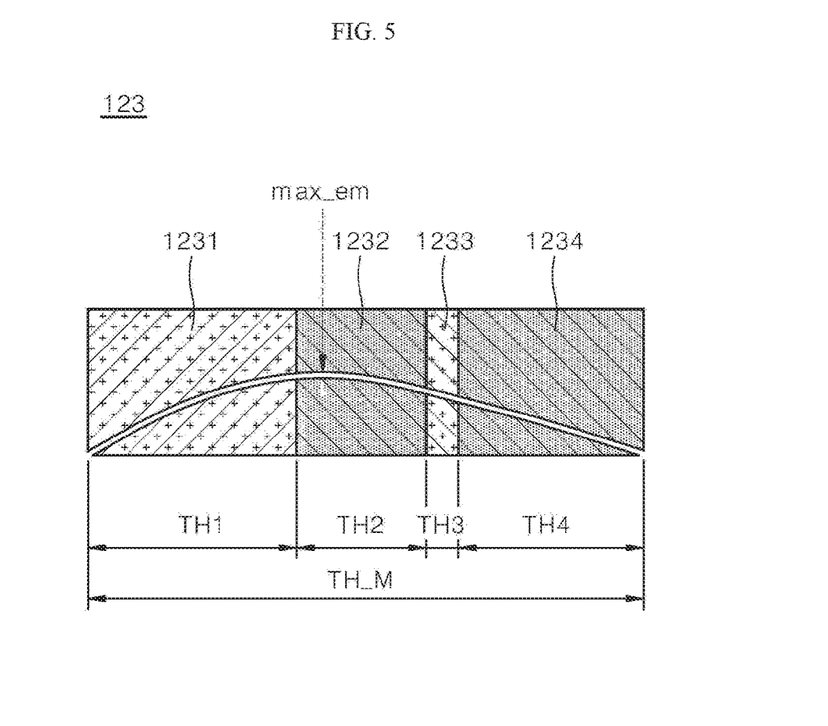
FIG. 5 shows one example of a light-emitting layer of a multi-layered structure and an associated exciton-profile in one embodiment of the present disclosure.

FIG. 4 shows the organic light-emitting element of FIG. 3 according to one embodiment of the present disclosure. FIG. 5 shows one example of a light-emitting layer of a multi-layered structure and an associated exciton-profile in one embodiment of the present disclosure.

FIGS. 6, 7, 8 and 9 illustrate examples of a light-emitting layer of a multi-layered structure according to one embodiment of the present disclosure.

Figure 10:
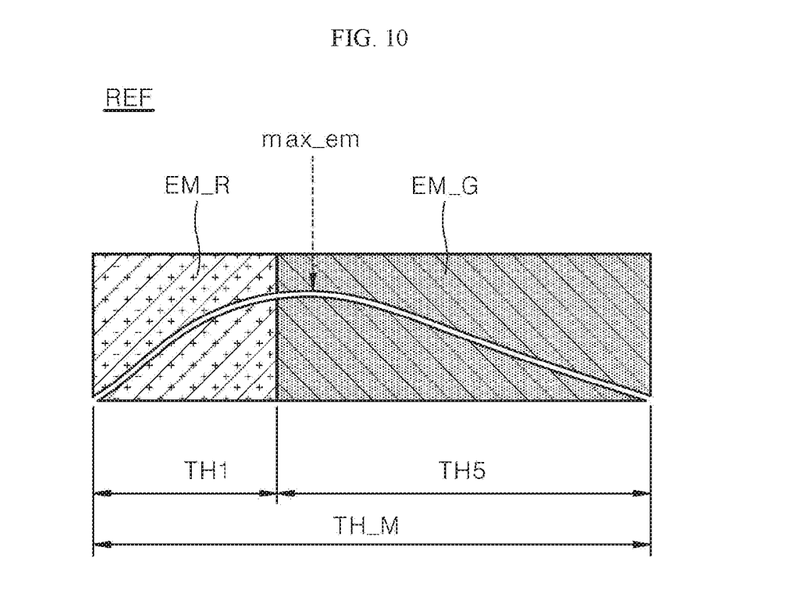
FIG. 10 shows one example of a light-emitting layer of a multi-layered structure and an associated exciton-profile in a conventional organic light-emitting display device.

FIG. 10 shows one example of a light-emitting layer of a multi-layered structure and an associated exciton-profile in a conventional organic light-emitting display device.

Figure 11:
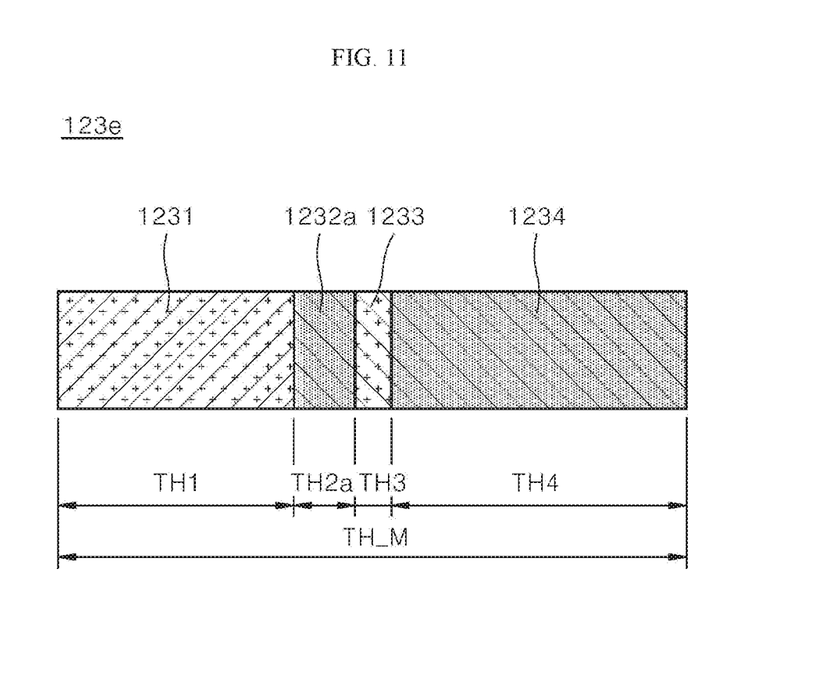
FIGS. 11, 12 and 13 show other examples of a light-emitting layer of a multi-layered structure according to one embodiment of the present disclosure.
Figure 12:
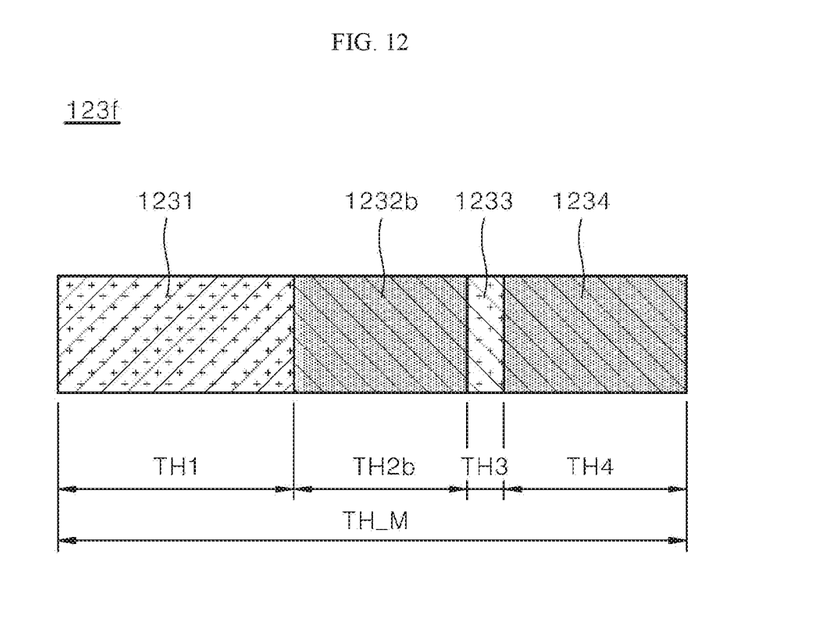
Figure 13:
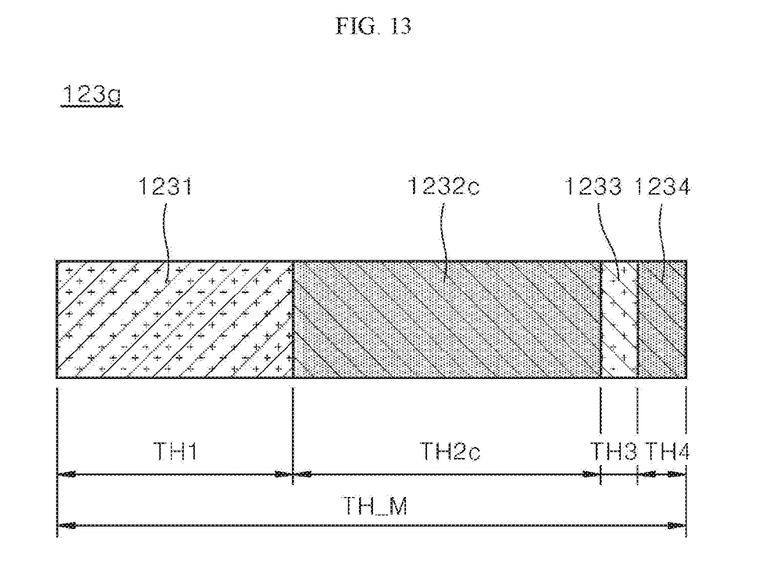

FIGS. 11, 12 and 13 show other examples of a light-emitting layer of a multi-layered structure according to one embodiment of the present disclosure.

Figure 14:
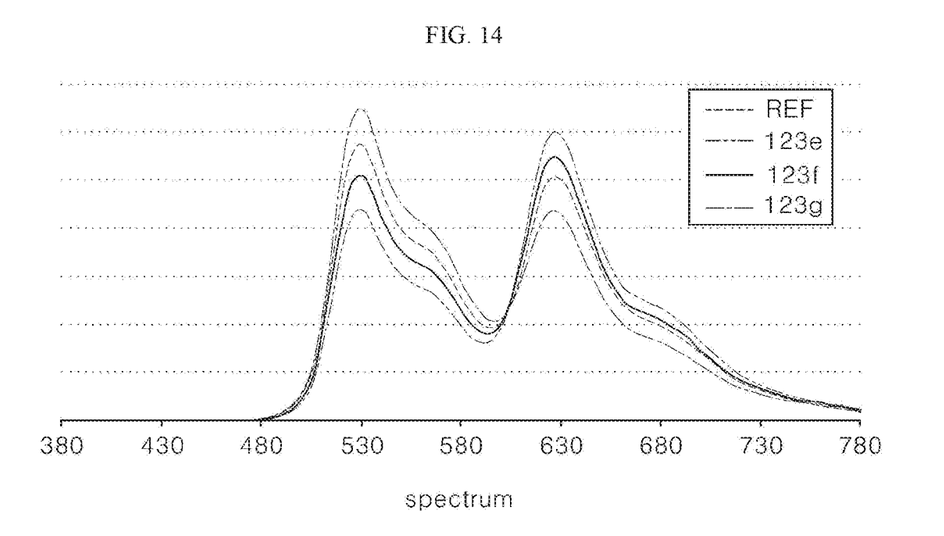
FIG. 14 shows a light spectrum corresponding to each of the light-emitting layers as shown in FIG. 10, FIG. 11, FIG. 12 and FIG. 13.

FIG. 14 shows a light spectrum corresponding to each of the light-emitting layers as shown in FIG. 10, FIG. 11, FIG. 12 and FIG. 13.

As shown in FIG. 4, an organic light-emitting element OLED of an organic light-emitting display device according to one embodiment of the present disclosure has first and second opposing electrodes 201 and 202 and the organic material layer 100 disposed between the first and second electrodes 201 and 202.

The organic material layer 100 includes at least one stack 110, 120 and 130 and charge generation layers 101 and 102 disposed between the stacks 110, 120 and 130.

Each stack 110, 120 and 130 includes opposing hole transport layer 121 and electron transport layer 122, and at least one light-emitting layer 123 interposed therebetween.

In particular, at least one of the stacks 110, 120 and 130, for example, the second stack 120 may include an emitting layer 123 of a multi-layered structure including first, second, third and fourth light-emitting layers 1231, 1232, 1233 and 1234.

In particular, any one of the at least one stack 110, 120 and 130, for example, the second stack 120 may include a hole transport layer 121 adjacent the first electrode 201, a first emitting layer 1231 disposed on the hole transport layer 121 and corresponding to a first color, a second light-emitting layer 1232 disposed on the first light-emitting layer 1231 and corresponding to the second color, which is different from the first color, the third light-emitting layer 1233 disposed on the second light-emitting layer 1232 and corresponding to the first color, a fourth light-emitting layer 1234 disposed on the third light-emitting layer 1233 and corresponding to the second color, and the electron transport layer 122 disposed on the fourth light-emitting layer 1234 and adjacent to the second electrode 202.

In this connection, considering the emission path, the first color corresponding to the first light-emitting layer 1231 has a longer wavelength range than that of the second color corresponding to the second and fourth light-emitting layers 1232 and 1234.

In one example, the first color may be a red color with the first wavelength range, for example 600 to 650 nm. The second color may be a green color with the second wavelength range shorter than the first wavelength range, for example, 500 to 550 nm.

In this case, among the at least one stacks 110, 120 and 130, at least one of others 110 and 130 may include a light-emitting layer (not shown) corresponding to a blue color with a third wavelength range shorter than the second wavelength range, for example, a with 400 to 450 nm.

The first light-emitting layer 1231 includes the first dopant (cross pattern in FIG. 4) corresponding to the first color and the first host (left-inclinedly hatched pattern in FIG. 4). This first light-emitting layer 1231 emits the first color.

In one example, when the first color is red, the first dopant may be an iridium compound with a wavelength range of 600 to 650 nm, and the first host may be at least one selected from tertiary aryl-amine derivatives and carbazole derivatives.

The second light-emitting layer 1232 contains the second dopant corresponding to the second color (dot pattern in FIG. 4) and the second host (pattern hatched as right-inclinedly in FIG. 4), which is different from the first host. This second light-emitting layer 1232 emits the second color.

In one example, when the second color is green, the second dopant may be an iridium compound with a wavelength range of 500 to 550 nm, and the second host may be selected from at least one of a carbazole derivative and a triazine-carbazole derivative.

The third light-emitting layer 1233 contains the first dopant and the second host.

That is, the third light-emitting layer 1233 includes the same second host as the second light-emitting layer 1232. Thereby, abrupt variations in mobility do not occur between the second and third light-emitting layers 1232 and 1233.

In addition, the third light-emitting layer 1233 includes the first dopant corresponding to the first color, similar to the first light-emitting layer 1231. The third light-emitting layer 1233, like the first light-emitting layer 1231, emits the first color.

The fourth light-emitting layer 1234 includes the second dopant and the second host, which are identical to those of the second light-emitting layer 1232. Thus, the fourth light-emitting layer 1234 emits the second color like the second light-emitting layer 1232.

Thus, according to one embodiment of the present disclosure, in the light-emitting layer 123 of the multi-layered structure, the first light-emitting layer 1231 includes the first host, whereas the second, third and fourth light-emitting layers 1232, 1233, and 1234 contain the second host. Therefore, the mobility varies rapidly at the boundary between the different first and second hosts, i.e., the boundary between the first and second light-emitting layers 1231 and 1232.

Accordingly, as shown in FIG. 5, the exciton-profile for the light-emitting layer 123 of the multi-layered structure defines a Gaussian shape corresponding to a region adjacent to the boundary between the first and second light-emitting layers 1231 and 1232. In this connection, the exciton-profile represents an expected amount of exciton generation from the light-emitting layer 123 of the multi-layered structure.

That is, the amount of excitons as generated from the region between the boundary between the first and the second light-emitting layers 1231 and 1232 and the center of the light-emitting layer 123 of the multi-layered structure may be expected to be a maximum value max_em.

Further, according to one embodiment of the present disclosure, the third light-emitting layer 1233 is disposed between the second and fourth light-emitting layers 1232 and 1234 corresponding to the second color. The third light-emitting layer 1233 has the first dopant corresponding to the first color as the same dopant as the first light-emitting layer 1231.

Therefore, the luminosity of the first color may be increased or decreased based on the amount of excitons generated in the region where the third light-emitting layer 1233 is disposed for the exciton-profile and the thickness TH3 of the third light-emitting layer 1233.

Further, regardless of the third light-emitting layer 1233, the total luminous efficiency corresponding to the light-emitting layer 123 of the multi-layered structure remains the same. Therefore, as the luminosity of the first color increases or decreases, the luminosity of the second color may be increased or decreased.

Thus, using the third light-emitting layer 1233, the luminosity of each of the first and second colors may be easily adjusted. As a result, the luminance and color coordinate of the organic light-emitting element may be easily controlled, which may improve the application range of the organic light-emitting display device.

In addition, since the third light-emitting layer 1233 is disposed between the second and fourth light-emitting layers 1232 and 1234 corresponding to the second color, the energy of the second dopants contained in each of the second and fourth light-emitting layers 1232 and 1234 may be easily transferred to the first dopant included in the third light-emitting layer 1233. As a result, the deterioration of the second dopant may be delayed. As a result, the life of the second color may be improved.

Specifically, a total thickness $TH\_M$ of the light-emitting layer 123, that is, the first, second, third and fourth light-emitting layers 1231, 1232, 1233, and 1234 of the multi-layered structure disposed between the hole transport layer 121 and the electron transport layer 122 may be selected from the range of 450 Å to 550 Å.

In this case, the thickness of the first light-emitting layer 1231 may be selected from the range of 150 Å to 200 Å such that the luminosity of the first color exceeds the threshold.

Further, the sum $TH2+TH4$ of thicknesses of the second and fourth light-emitting layers 1232 and 1234 may be selected from the range of 300 Å to 350 Å so that the luminosity of the second color exceeds the threshold value.

In this connection, the thickness $TH2$ of the second light-emitting layer 1232 disposed between the first and third light-emitting layers 1231 and 1233 may be selected from the range of 100 Å to 300 Å.

In particular, depending on whether a color whose a luminosity decreases or increases is the first or second color, the thickness $TH2$ of the second light-emitting layer 1232 may be selected from the range of 100 Å to 200 Å, or from the range of 200 Å to 300 Å. This will be described in more detail below.

Based on the thickness $TH2$ of the second light-emitting layer 1232, the thickness $TH4$ of the fourth light-emitting layer 1234 may be selected from the range of 50 Å to 250 Å.

Further, the thickness $TH3$ of the third light-emitting layer 1233 may be selected from the range of 10 Å to 20 Å. Thus, the luminosity of the first color may be adjusted by the third light-emitting layer 1233, while the power consumption of the organic light-emitting element OLED may be prevented from being increased. That is, when the thickness $TH3$ of the third light-emitting layer 1233 exceeds 20 Å, there occurs a problem that power consumption of the organic light-emitting element OLED increases. In addition, when the thickness $TH3$ of the third light-emitting layer 1233 is smaller than 10 Å, the change in luminosity of the first color by the third light-emitting layer 1233 is insignificant, and the lifespan change of each of the first and second colors is insignificant.

Figure 6:
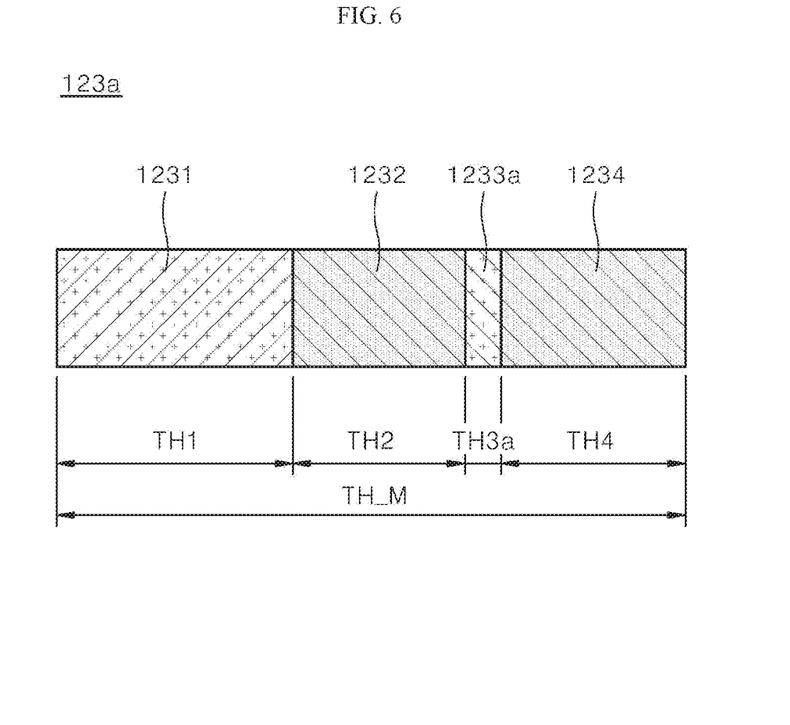
FIGS. 6, 7, 8 and 9 illustrate examples of a light-emitting layer of a multi-layered structure according to one embodiment of the present disclosure.
Figure 7:
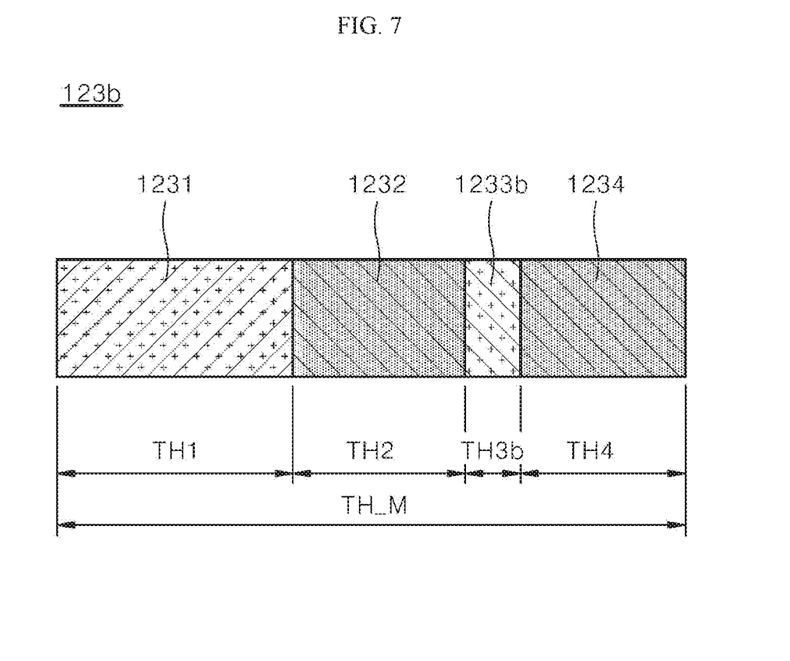
Figure 8:
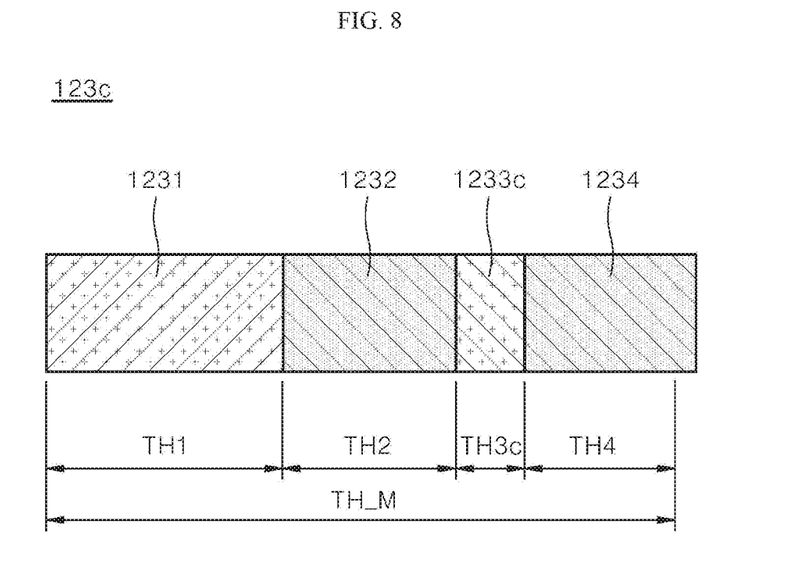
Figure 9:
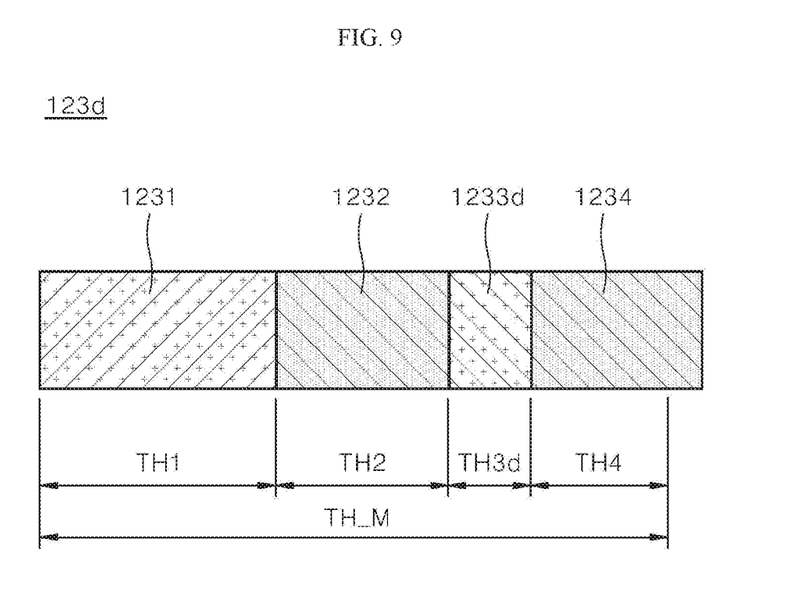

The example 123a of FIG. 6 shows that the thickness $TH3a$ of the third light-emitting layer 1233a is 20 Å. The examples 123b, 123c and 123d of FIGS. 7, 8 and 9 show that the thicknesses $TH3b$, $TH3c$ and $TH3d$ of the third light-emitting layers 1233b, 1233c and 1233d are 40 Å, 60 Å and 80 Å, respectively.

In this connection, the followings are assumed in the examples of FIG. 6, FIG. 7, FIG. 8 and FIG. 9: the thickness $TH1$ of the first light-emitting layer 1231 is 200 Å; the thickness $TH2$ of the second light-emitting layer 1232 is 140 Å; the thickness $TH4$ of the fourth light-emitting layer 1234 is 140 Å; in addition, the first color is red color and the second color is green color.

The simulation results for the electrical-optical properties and lifespan of these examples 123a, 123b, 123c, and 123d are shown in Table 1 below

TABLE 1

| | Electrical-optical property (10 mA/m$^2$) | | | | | |
|---|---|---|---|---|---|---|
| | Volt | | GREEN | RED | Lifespan | |
| Example | (V) | EQE | luminosity | luminosity | GREEN | RED |
| 123a | 100% | 100% | 100% | 100% | 100% | 100% |
| 123b | 101% | 100% | 102% | 100% | 104% | 90% |
| 123c | 102% | 102% | 98% | 103% | 105% | 103% |
| 123d | 103% | 103% | 97% | 104% | 103% | 105% |

As shown in Table 1, when each of the thicknesses TH3b, TH3c, and TH3d of the third light-emitting layers 1233b, 1233c, and 1233d exceeds 20 Å (examples 123b, 123c, and 123d), the voltage Volt increases instead of increasing the external quantum efficiency (EQE), compared to the example 123a in FIG. 6.

That is, when the thickness TH3 of the third light-emitting layer 1233 is greater than 20 Å, the power consumption of the organic light-emitting element OLED is increased.

With respect to the exciton-profile, the amount of generated excitons corresponding to the third light-emitting layer 1233 is adjusted based on the distance between the boundary between the first and second light-emitting layers 1231 and 1232 and the region where the third light-emitting layer 1233 is located, i.e., the third light-emitting layer 1233. In this connection, the distance between the boundary between the first and second light-emitting layers 1231 and 1232 and the region where the third light-emitting layer 1233 is located, i.e., the third light-emitting layer 1233 may correspond to the thickness TH2 of the second light-emitting layer 1232.

FIG. 10 shows an absence of the third light-emitting layer 1233 disposed between the second and fourth light-emitting layers 1232 and 1234 corresponding to the second color, that is, shows, a light-emitting layer REF of a conventional multi-layered structure.

As shown in FIG. 10, the light-emitting layer REF of the conventional multi-layered structure includes a red light-emitting layer EM_R corresponding to red and a green light-emitting layer EM_G corresponding to green.

As with one embodiment of the present disclosure, the total thickness TH_M corresponding to the light-emitting layer REF of the conventional multi-layered structure may be selected from the range of 450 Å to 550 Å.

In addition, as with the first light-emitting layer (1231 of FIG. 5) according to one embodiment of the present disclosure, the thickness TH1 of the red light-emitting layer EM_R may be selected from the range of 150 Å to 200 Å to ensure red luminosity.

In this regard, the thickness TH5 of the green light-emitting layer EM_G may be selected from the range of 300 Å to 350 Å.

The exciton-profile corresponding to the light-emitting layer REF of this conventional multi-layered structure defines the shape corresponding to the region adjacent to the boundary between the red light-emitting layer EM_R and the green light-emitting layer EM_G. That is, the exciton generation amount from the region between the boundary between the red light-emitting layer EM_R and the green light-emitting layer EM_G and the center of the light-emitting layer REF of the multi-layered structure may be predicted to be the maximum value max ref.

For comparison, as shown in Table 2 below, examples 123e, 123f and 123g of FIGS. 11, 12 and 13 show that the thicknesses TH2a, TH2b and TH2c of the second light-emitting layers 1232a, 1232b and 1232c are 20 Å, 140 Å, and 260 Å respectively.

In this connection, according to Table 2 below, it may be assumed that in the light-emitting layer REF of the conventional multi-layered structure of FIG. 10 and in each of the examples 123e, 123f, and 123g of FIG. 11, FIG. 12 and FIG. 13, the total thickness TH_M is 500 Å and the thickness TH1 of the first light-emitting layer 1231 is 200 Å.

The simulation results for the electrical-optical properties and lifespan of each of the light-emitting layer REF of the conventional multi-layered structure and the examples 123e, 123f, and 123g of FIG. 11, FIG. 12 and FIG. 13, under the conditions of Table 2 below are shown in Table 3 below.

TABLE 2

| Thickness/Example | REF | 123e | 123f | 123g |
|---|---|---|---|---|
| First light-emitting layer thickness | 200 Å | 200 Å | 200 Å | 200 Å |
| Second light-emitting layer thickness | 300 Å | 20 Å | 140 Å | 260 Å |
| Third light-emitting layer thickness | — | 20 Å | 20 Å | 20 Å |
| Fourth light-emitting layer thickness | — | 260 Å | 140 Å | 20 Å |

TABLE 3

| | Electrical-optical property (10 mA/m$^2$) | | | | | |
|---|---|---|---|---|---|---|
| | | | GREEN | RED | Lifespan | |
| Example | Volt (V) | EQE | luminosity | luminosity | GREEN | RED |
| REF | 100% | 100% | 100% | 100% | 100% | 100% |
| 123e | 101% | 99% | 77% | 118% | Non-measurable | Non-measurable |
| 123f | 102% | 99% | 89% | 108% | 104% | 181% |
| 123g | 101% | 98% | 113% | 86% | 111% | 114% |

When the thickness TH2a of the second light-emitting layer 1232a is 20 Å, which is smaller than 100 Å, as in the example 123e in FIG. 11, it may be seen as shown in Table 3, that the lifespan of each of the first and second colors RED and GREEN fluctuates unstably so that it may not be measurable. As a result, the lifespan reliability of the organic light-emitting element OLED may be deteriorated.

When the thickness TH2b of the second light-emitting layer 1232b is 140 Å selected from the range of 100 Å to 200 Å, as in the example 123f of FIG. 12, it may be seen as shown in Table 3 that the luminosity and lifespan of the first color RED are improved compared to the light-emitting layer REF of the conventional multi-layered structure.

Further, when the thickness TH2c of the second light-emitting layer 1232c is 260 Å as selected from a range of 200 Å to 300 Å, as in the example 123g of FIG. 13, it may be seen as shown in Table 3 that the luminosity and lifespan of the second color GREEN are improved compared to the light-emitting layer REF of the conventional multi-layered structure. In this connection, it may be confirmed that the lifespan of the first color RED is also improved.

Thus, with respect to the exciton-profile, the amount of excitons as generated corresponding to the third light-emitting layer 1233 may be controlled based on the thickness TH2 of the second light-emitting layer 1232, that is, based on the spacing between the third light-emitting layer 1233 and the boundary between the first and the second light-emitting layers 1231 and 1232. Therefore, the luminosity of each of the first and second colors may be adjusted.

That is, as shown in FIG. 14, the luminosity of each of the first and second colors may be easily adjusted based on the presence or absence of the third light-emitting layer 1233, and a location where the third light-emitting layer 1233 is disposed. In FIG. 14, the vertical axis represents the luminosity of each spectrum.

As a result, the luminance and color coordinate of the organic light-emitting element may be easily adjusted. As a result, the application range of organic light-emitting display devices may be improved.

In the above description, numerous specific details are set forth in order to provide a thorough understanding of the present disclosure. The present disclosure may be practiced without some or all of these specific details. Examples of various embodiments have been illustrated and described above. It will be understood that the description herein is not intended to limit the claims to the specific embodiments described. On the contrary, it is intended to cover alternatives, modifications, and equivalents as may be included within the spirit and scope of the present disclosure as defined by the appended claims.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An organic light-emitting display device including an organic light-emitting element, wherein the organic light-emitting element includes:
   first and second electrodes; and
   an organic material layer disposed between the first and second electrodes, the organic material layer including a first stack, a second stack, and a charge generation layer disposed between the first stack and second stack,
   wherein any one of the first and second stacks includes:
   a hole transport layer adjacent to the first electrode;
   a first light-emitting layer disposed on the hole transport layer;
   a second light-emitting layer disposed on the first light-emitting layer;
   a third light-emitting layer disposed on the second light-emitting layer; a fourth light-emitting layer disposed on the third light-emitting layer; and
   an electron transport layer disposed on the fourth light-emitting layer and adjacent to the second electrode,
   wherein:
   the first light-emitting layer includes a first dopant corresponding to a first color and a first host,
   the second light-emitting layer includes a second dopant corresponding to a second color different from the first color, and a second host different from the first host,
   the third light-emitting layer includes the first dopant and the second host, and
   the fourth light-emitting layer includes the second dopant and the second host.

2. The organic light-emitting display device of claim 1, wherein a thickness of the third light-emitting layer is selected from a range of 10 Å to 20 Å.

3. The organic light-emitting display device of claim 2, wherein a thickness of the second light-emitting layer is selected from a range of 100 Å to 200 Å.

4. The organic light-emitting display device of claim 2, wherein a thickness of the second light-emitting layer is selected from a range of 200 Å to 300 Å.

5. The organic light-emitting display device of claim 2, wherein the thickness of the fourth light-emitting layer is selected from a range of 50 Å to 250 Å.

6. The organic light-emitting display device of claim 4, wherein a sum of the thicknesses of the first, second, third, and fourth light-emitting layers is selected from a range of 450 Å to 550 Å,
   wherein the thickness of the first light-emitting layer is selected from a range of 150 Å to 200 Å.

7. The organic light-emitting display device of claim 2, wherein the first color has a longer wavelength than the second color.

8. The organic light-emitting display device of claim 7, wherein the first color is red and the second color is green.

* * * * *